United States Patent
Konno et al.

(10) Patent No.: US 8,808,446 B2
(45) Date of Patent: Aug. 19, 2014

(54) COMPOSITION FOR RESIST UNDERLAYER FILM AND PROCESS FOR PRODUCING SAME

(75) Inventors: Keiji Konno, Tokyo (JP); Masato Tanaka, Tokyo (JP); Momoko Ishii, Tokyo (JP); Junichi Takahashi, Tokyo (JP); Tomoki Nagai, Tokyo (JP)

(73) Assignee: JSR Corporation, Tokyo (JP)

( * ) Notice: Subject to any disclaimer, the term of this patent is extended or adjusted under 35 U.S.C. 154(b) by 305 days.

(21) Appl. No.: 11/816,642

(22) PCT Filed: Feb. 24, 2006

(86) PCT No.: PCT/JP2006/303492
§ 371 (c)(1),
(2), (4) Date: Aug. 20, 2007

(87) PCT Pub. No.: WO2006/093057
PCT Pub. Date: Sep. 8, 2006

(65) Prior Publication Data
US 2009/0050020 A1    Feb. 26, 2009

(30) Foreign Application Priority Data

Mar. 1, 2005 (JP) ................. 2005-055812
Nov. 15, 2005 (JP) ................. 2005-330194

(51) Int. Cl.
| | | |
|---|---|---|
| C09D 4/00 | (2006.01) | |
| G03F 7/075 | (2006.01) | |
| C07F 7/08 | (2006.01) | |
| H01L 21/027 | (2006.01) | |
| G03F 7/11 | (2006.01) | |
| H01L 21/033 | (2006.01) | |

(52) U.S. Cl.
CPC ............ G03F 7/0752 (2013.01); G03F 7/0751 (2013.01); H01L 21/0274 (2013.01); G03F 7/11 (2013.01); H01L 21/0332 (2013.01); Y10S 430/106 (2013.01); Y10S 430/115 (2013.01)
USPC ................. 106/287.12; 430/270.1; 430/272.1; 430/905; 430/914; 428/414; 428/429; 428/447; 428/448

(58) Field of Classification Search
USPC .............. 106/287, 287.12; 430/270.1, 272.1, 430/905, 904; 428/141, 429, 447, 448
IPC ....... G03C 1/73,1/825; G03F 7/075; C07F 7/08
See application file for complete search history.

(56) References Cited

U.S. PATENT DOCUMENTS

| | | |
|---|---|---|
| 6,183,935 B1 | 2/2001 | Hanabata et al. |
| 6,383,559 B1 | 5/2002 | Nakamura et al. |
| 6,534,235 B1 * | 3/2003 | Hanabata et al. ............. 430/191 |
| 6,576,393 B1 | 6/2003 | Sugita et al. |
| 6,808,869 B1 | 10/2004 | Mizutani et al. |
| 7,163,778 B2 | 1/2007 | Hatakeyama et al. |
| 2004/0191479 A1 * | 9/2004 | Hatakeyama et al. ........ 428/141 |
| 2004/0258927 A1 * | 12/2004 | Conzone et al. .............. 428/429 |

FOREIGN PATENT DOCUMENTS

| | | | |
|---|---|---|---|
| EP | 0260976 | 3/1988 | |
| EP | 1426822 | 6/2004 | |
| JP | 03-45510 | 2/1991 | |
| JP | 06-267934 A | 9/1994 | |
| JP | 2000-356854 | 12/2000 | |
| JP | 2004-310019 A | 11/2004 | |
| JP | 2005-023257 | * 1/2005 | ............... G02B 1/11 |
| KR | 2000-77018 | 12/2000 | |
| WO | WO 03/044077 | 5/2003 | |

OTHER PUBLICATIONS

Machine translation of Suzuki (JP2005-023257).*
Extended European Search Report for corresponding EP Application No. 06714631.6-2222, Dec. 16, 2010.
Office Action with Form PTO-892 Notice of References Cited issued by the U.S. Patent and Trademark Office for the continuation U.S. Appl. No. 12/715,406, Jan. 18, 2012.
Taiwanese Office Action for corresponding Taiwan Application No. 095106828, Jul. 6, 2012.
Office Action issued by the U.S. Patent and Trademark Office for the continuation U.S. Appl. No. 12/715,406, Jun. 22, 2012.

* cited by examiner

*Primary Examiner* — Jun Li
(74) *Attorney, Agent, or Firm* — Ditthavong & Steiner, P.C.

(57) ABSTRACT

A composition for a resist underlayer film is provided. The composition has excellent storage stability and can form a resist underlayer film which has excellent adhesion to a resist film, can improve reproducibility of a resist pattern and is resistant to an alkaline liquid used in development and to oxygen ashing during the removal of a resist. The composition comprises a hydrolyzate and/or a condensate of a silane compound of the following formula (A), $$R^1_b R^2_c Si(OR^3)_{4-a} \qquad (A)$$

wherein $R^1$ is a monovalent organic group having at least one unsaturated bond, $R^2$ individually represents a hydrogen atom, a halogen atom or a monovalent organic group, $R^3$ individually represents a monovalent organic group, $R^1$ is a group other than $OR^3$, a is an integer of 1 to 3, b is an integer of 1 to 3, and c is an integer of 0 to 2, provided that a=b+c.

12 Claims, No Drawings

COMPOSITION FOR RESIST UNDERLAYER FILM AND PROCESS FOR PRODUCING SAME

TECHNICAL FIELD

The present invention relates to a composition for a resist underlayer film for forming an underlayer film used as a ground when producing a resist pattern on a substrate, and to a process for producing the same.

BACKGROUND ART

In order to form patterns in the manufacture of semiconductor devices and the like, microfabrication of organic or inorganic substrates is performed using a pattern-transfer method in which a lithography technology, a resist development process, and an etching technique are applied.

However, along with the progress of high integration of semiconductor devices in circuit boards, it has become difficult to correctly transfer an optical mask pattern to a resist film in an exposure step. For example, during a microfabrication process of a substrate, a dimensional error (deviation) may be produced in the pattern formed due to the effect of a standing wave of light formed in a resist film. In order to reduce the effect of such a standing wave, an antireflection film is formed between the resist film and the substrate surface.

A resist pattern is also used as a mask when a substrate with a silicon oxide film, an inorganic interlayer dielectric, or the like formed thereon is processed. It is necessary to reduce the thickness of the resist film and the antireflection film along with the progress of miniaturization of patterns. Since slimming of a resist film lowers mask performance of the resist film, there is a tendency that it is more difficult to provide a substrate with desired microfabrication without damaging it.

As a solution to this problem, a method of forming an underlayer for processing on an oxide film or an interlayer dielectric of a substrate to be fabricated, transferring a resist pattern to the underlayer, and dry-etching the oxide film or the interlayer dielectric using this underlayer film for processing as a mask is used. Since the reflectance of such an underlayer for processing changes with the film thicknesses, it is necessary to adjust the composition and the like to minimize the reflectance according to the film thickness. Other requirements demanded of the underlayer for processing include capability of forming a resist pattern without a skirt-like foot and the like, excellent adhesion to the resist, a sufficient masking property when processing an oxide film and an interlayer dielectric, excellent storage stability as a solution, and the like.

However, the underlayer for processing a substrate proposed heretofore, for example, an underlayer for processing made from a composition containing a hydrolyzate and/or a condensate of a specific silane compound (refer to patent documents 1 and 2) did not satisfy all of these requirements. The materials have the problems of poor adhesion to resist patterns and the like.

[Patent document 1] Japanese Patent Application Laid-open No. 2000-356854
[Patent document 2] Japanese Patent Application Laid-open No. 3-45510

DISCLOSURE OF THE INVENTION

Problems to be Solved by the Invention

An object of the present invention is to provide a composition for a resist underlayer film, which has excellent storage stability and can form a resist underlayer film which has excellent adhesion to a resist film, can improve reproducibility of a resist pattern and is resistant to an alkaline liquid used in development and to oxygen ashing during removal of a resist.

Means for Solving the Problems

The present inventors have conducted extensive studies in order to achieve the above object. As a result, the inventors have found that a resist underlayer film made from a composition comprising a hydrolyzate and/or a condensate of a silane compound having an unsaturated bond can increase adhesion with a resist due to the Π electron interaction of the unsaturated bond. This finding has led to the completion of the present invention.

Specifically, the composition for a resist underlayer film of the present invention comprises a hydrolyzate and/or a condensate of a silane compound represented by the following formula (A), $$R^1{}_bR^2{}_cSi(OR^3)_{4-a} \quad (A)$$

wherein $R^1$ is a monovalent organic group having at least one unsaturated bond, $R^2$ individually represents a hydrogen atom, a halogen atom or a monovalent organic group, $R^3$ individually represents a monovalent organic group, $R^1$ is a group other than $OR^3$, a is an integer of 1 to 3, b is an integer of 1 to 3, and c is an integer of 0 to 2, provided that a=b+c.

A second composition for a resist underlayer film of the present invention comprises a hydrolyzate and/or a condensate of a mixture containing at least one silane compound represented by the above formula (A), and at least one silane compound represented by the following formula (B) and/or at least one silane compound represented by the following formula (C), $$Si(OR^3)_4 \quad (B)$$

wherein $R^3$ represents a monovalent organic group, $$(R^4)_d Si(OR^3)_{4-d} \quad (C)$$

wherein $R^3$ represents a monovalent organic group, $R^4$ individually represents a hydrogen atom, a halogen atom or a monovalent organic group (excluding $R^1$ and $OR^3$), and d is an integer of 1 to 3.

A third composition for a resist underlayer film of the present invention comprises a mixture of (I) a hydrolyzate and/or a condensate of a mixture containing at least two compounds selected from the group consisting of the silane compound represented by the above formula (A), the silane compound represented by the above formula (B) and the silane compound of the above formula (C), and (II) a hydrolyzate and/or a condensate of a mixture containing at least one compound selected from the group consisting of the silane compound represented by the above formula (A), the silane compound represented by the above formula (B) and the silane compound represented by the above formula (C), wherein the silane compound represented by the above formula (A) is included in at least one of the mixtures for preparing the component (I) or the component (II), provided that the component (I) and the component (II) are different.

A fourth composition for a resist underlayer film of the present invention comprises a composition containing a hydrolyzate and/or a condensate of at least one silane compound represented by the above formula (A), and a hydrolyzate and/or a condensate of at least one silane compound represented by the above formula (B) and/or a hydrolyzate and/or a condensate of at least one silane compound represented by the above formula (C).

$R^1$ group of the silane compound represented by the formula (A) may contain an aromatic ring and preferably includes, for example, a phenyl group, an aminophenyl group, an indenyl group, a biphenyl group, a terphenyl group, a naphthyl group, an acenaphthyl group or an anthryl group.

$R^1$ group of the silane compound represented by the formula (A) may contain a nitrogen atom and preferably includes, for example, an amide group, an allylamino group, a cyanate group, a thiocyanate group, a thioisocyanate group, isocyanate group, carbamic acid group, a carbamate group, a (meth)acryloxyhydroxyalkylamino group, a cyano group, a ketoxime group, an N-propagiloxy group, a caprolactam structure, an oxazolidinone structure, an isocyanurate structure, a pyrrolidone structure, an aniline structure, an uracil structure, a cytosine structure, a pyridine structure, an imidazole structure, a pyrrole structure or a triazole structure.

Furthermore, $R^1$ group of the silane compound represented by the formula (A) may contain a nitrogen atoms and the above-mentioned aromatic ring.

In addition, the composition for a resist underlayer film of the present invention preferably further contains an acid-producing compound which generates an acid by irradiation of ultraviolet radiation and/or by heating.

The process for producing the composition for a resist underlayer film of the present invention comprises a step of hydrolyzing and/or condensing the above-mentioned silane compound used in the composition in an organic acid in the presence of water and a catalyst.

Effect of the Invention

The composition for a resist underlayer film of the present invention has excellent storage stability and can form a resist underlayer film which excels in adhesion to a resist film, can improve reproducibility of a resist pattern and is resistant to an alkaline liquid used in development and to oxygen ashing during removal of a resist.

BEST MODE FOR CARRYING OUT THE INVENTION

The composition for a resist underlayer film and a process for producing the composition will be described in detail.
[Composition for Resist Underlayer Film]

The following compositions can be given as embodiments of the composition for a resist underlayer film of the present invention:

a composition comprising a hydrolyzate and/or a condensate of at least one silane compound represented by the formula (A) (hereinafter referred to from time to time as "silane compound (A)"), a composition comprising a hydrolyzate and/or a condensate of a mixture containing the silane compound (A), and at least one silane compound represented by the formula (B) (hereinafter referred to from time to time as "silane compound (B)") and/or at least one silane compound represented by the formula (C) (hereinafter referred to from time to time as "silane compound (C)"), a composition comprising (I) a hydrolyzate and/or a condensate of a mixture containing at least two compounds selected from the group consisting of the silane compound (A), the silane compound (B) and the silane compound (C), and (II) a hydrolyzate and/or a condensate of a mixture containing at least one compound selected from the group consisting of the silane compound (A), the silane compound (B) and the silane compound (C) (provided that the component (I) and the component (II) are different and the silane compound (A) is included in at least one of the mixtures for preparing the component (I) or the component (II)), and a composition comprising a mixture containing a hydrolyzate and/or a condensate of the silane compound (A) and a hydrolyzate and/or a condensate of the silane compound (B) and/or the silane compound (C).

<Silane Compound (A)>

The silane compound (A) is represented by the formula $R^1{}_b R^2{}_c Si(OR^3)_{4-a}$, wherein $R^1$ is a monovalent organic group having at least one unsaturated bond, $R^2$ individually represents a hydrogen atom, a halogen atom or a monovalent organic group, $R^3$ individually represents a monovalent organic group, $R^1$ is a group other than $OR^3$, a is an integer of 1 to 3, b is an integer of 1 to 3, and c is an integer of 0 to 2, provided that $a=b+c$. The monovalent organic group having an unsaturated bond shown by $R^1$ may be either linear or branched. The monovalent organic group shown by $R^2$ may be either the same as or different from the $R^1$.

As the monovalent organic group having an unsaturated bond, a vinyl group, an allyl group, an aryl group, a styryl group, a cinnamoyl group, a cinnamyl group, a methacryloyl group, an acryloyl group, an acetyl group, a methylidene group, an ethylidene group, an isopropylidene group, an ethylidyne group, a vinylidene group, a methylene group, a propylene group, an ethenyl group, a pentanyl group, a propynyl group, a butenyl group, a butadienyl group, an isopropenyl group, a butadylidene group, a propadienedilidene group, a benzyl group, a cumyl group, a mesyl group, a tosyl group, a xylyl group, a benzylidene group, a cynamylidene group, an indenyl group, a pyrenyl group, an acenaphtyl group, a phenanthryl group, a naphthyl group, an anthryl group, a bicyclooctenyl group, a bicycloheptenyl group, a bicycloundecyl group, a phenyl group, a biphenyl group, a terphenyl group, a diphenylmethane group, an aminophenyl group, a stilbene group, a fulvene group, a camphene group, an azepine group, a triazine group, a triazole group, an azocyan group, a thienyl group, a thianthrenyl group, a furyl group, a pyranyl group, an isobenzofuranyl group, a chloromethyl group, a xantenyl group, a phenoxathyl group, a pyrrolyl group, an imidazolyl group, a pyrazolyl group, an isothiazolyl group, an isooxazolyl group, a pyridyl group, a pyrimidinyl group, a pyridazinyl group, an indolizinyl group, an isoindolyl group, a purynyl group, a quinolidinyl group, an isoquinolyl group, a quinolyl group, a phthaladinyl group, a naphthylidinyl group, a quinoxalinyl group, a quinazolinyl group, a cynnolinyl group, a carbazoyl group, a phenanthridinyl group, a acridinyl group, a perimidinyl group, a furazanyl group, a phenoxazinyl group, a pyrazonilyl group, a nitro group, a diazo group, an azido group, a carboxy group, a sulfo group, a carbamoyl group, an aldehyde group, an amide group, an allylamino group, a keto group, an ester group, a formyl group, an acetyl group, a propionyl group, a butyryl group, a valenyl group, an isovalenyl group, an oxalyl group, a malonyl group, a succinyl group, a maleoyl group, a benzoyl group, a phthaloyl group, an isophthaloyl group, a terephthaloyl group, a naphthoyl group, a toluoyl group, a furoyl group, a lactoyl group, an acetoxyl group, a methanesulfonyl group, a thiocarbonyl group, an isocyanate group, a cyanate group, a thiocyanate group, a thioisocyanate group, a carbamic acid group, a carbamate group, an N-propagyloxy group, an isocyano group, a cyano group, an imino group, a ketoxime group, a benzyloxy group, a naphthyloxy group, a pyridyloxy group, a (meth)acryloxyhydroxyalkylamino group, a sulfonyldioxy group, and a carbonyldioxy group, as well as an organic group containing these groups, can be given.

Among these groups, a vinyl group, an isocyanate group, a cyano group, an acetoxy group, an allyl group, an acryloyl group, a methacryloyl group, a group containing an aromatic ring, and a group containing a nitrogen atom are preferable.

As the group containing an aromatic ring, a group containing a phenyl group, an aminophenyl group, an indenyl group, a biphenyl group, a terphenyl group, a naphthyl group, an acenaphthyl group, or an anthryl group is preferable.

As the group containing a nitrogen atom, a group containing an amide group, an allylamino group, a cyanate group, a thiocyanate group, a thioisocyanate group, an isocyanate group, a carbamic acid group, a carbamate group, a (meth)acryloxyhydroxyalkylamino group, a cyano group, a ketoxime group, an N-propagyloxy group, a caprolactam structure, an oxazolidinone structure, an isocyanurate structure, a pyrrolidone structure, an aniline structure, an uracil structure, a cytosine structure, a pyridine structure, an imidazole structure, a pyrrole structure, or a triazole structure is preferable.

The monovalent organic group having an unsaturated bond may be a group containing an aromatic ring in addition to a nitrogen atom.

The following compounds can be given as examples of the silane compound (A): acetoxyethyltrimethoxysilane, acetoxyethylmethyldimethoxysilane, acetoxyethyldimethylmethoxysilane, acetoxyethyltriethoxysilane, acetoxyethylmethyldiethoxysilane, acetoxyethyldimethylethoxysilane, acetoxymethyltrimethoxysilane, acetoxymethylmethyldimethoxysilane, acetoxymethyldimethylmethoxysilane, acetoxymethyltriethoxysilane, acetoxymethylmethyldiethoxysilane, acetoxymethyldimethylethoxysilane, acetoxypropyltrimethoxysilane, acetoxypropylmethyldimethoxysilane, acetoxypropyldimethylmethoxysilane, acetoxypropyltriethoxysilane, acetoxypropylmethyldiethoxysilane, acetoxypropyldimethylethoxysilane, N-3-(acryloxy-2-hydroxypropyl)-3-aminopropyltriethoxysilane, (3-acryloxypropyl)trimethoxysilane, (3-acryloxypropyl)methyldimethoxysilane, (3-acryloxypropyl)dimethylmethoxysilane, (3-acryloxypropyl)triethoxysilane, (3-acryloxypropyl)methylethoxysilane, (3-acryloxypropyl)dimethylethoxysilane, 3-(N-allylamino)propyltrimethoxysilane, 3-(N-allylamino)propylmethyldimethoxysilane, 3-(N-allylamino)propyldimethylmethoxysilane, 3-(N-allylamino)propyltriethoxysilane, 3-(N-allylamino)propylmethyldiethoxysilane, 3-(N-allylamino)propyldimethylethoxysilane, allyl(chloropropyl)dimethoxysilane, allyl(chloropropyl)diethoxysilane, allyl[(3-cyclohexenyl-2-ethyl)]dimethoxysilane, allyl[(3-cyclohexenyl-2-ethyl)]diethoxysilane, allyldimethoxysilane, allyldiethoxysilane, allylmethyldimethoxysilane, allylmethyldiethoxysilane, allyldimethylmethoxysilane, allyldimethylethoxysilane, allylhexyldimethoxysilane, allylhexyldiethoxysilane, allyloxytrimethoxysilane, 2-allyloxyethylthiomethyltrimethoxysilane, O-allyloxy(polyethyleneoxy)trimethoxysilane, allylphenyldimethoxysilane, allylphenyldiethoxysilane, (aminoethylaminomethyl)phenethyltrimethoxysilane, (aminoethylaminomethyl)phenethyltriethoxysilane, 3-(m-aminophenoxy)propyltrimethoxysilane, 3-(m-aminophenoxy)propyltriethoxysilane, m-aminophenyltrimethoxysilane, m-aminophenyltriethoxysilane, p-aminophenyltrimethoxysilane, p-aminophenyltriethoxysilane, benzoyloxypropyltrimethoxysilane, benzoylpropyltriethoxysilane, benzyltrimethoxysilane, benzyltriethoxysilane, benzylmethyldimethoxysilane, benzylmethyldiethoxysilane, benzyloxytrimethoxysilane, benzyloxytriethoxysilane, 5-(bicycloheptenyl)trimethoxysilane, 5-(bicycloheptenyl)triethoxysilane, 5-(bicycloheptenyl)methyldimethoxysilane, 5-(bicycloheptenyl)methyldiethoxysilane, 5-(bicycloheptenyl)dimethylmethoxysilane, 5-(bicycloheptenyl)dimethylethoxysilane, bis(cyanopropyl)dimethoxysilane, bis(cyanoropropyl)diethoxysilane, bis(N-methylbenzamide)ethoxymethylsilane, bis(trimethoxysilyl)acetylene, bis(triethoxysilyl)acenaphthylene, bis(triethoxysilyl)ethylene, bis(triemethoxysilyl)ethylene, bis(triethoxysilyl)-1,7-octadiene, bis[3-(triethoxysilyl)propyl]urea, bis(trimethoxysilylethyl)benzene, bis(triethoxysilylethyl)benzene, bromophenyltrimethoxysilane, butenyltrimethoxysilane, butenyltriethoxysilane, butenylmethyldimethoxysilane, butenylmethyldiethoxysilane, 2-(chloromethyl)allyltrimethoxysilane, 2-(chloromethyl)allyltriethoxysilane, (chloromethylphenyl)ethyltrimethoxysilane, (chloromethylphenyl)ethyltriethoxysilane, (chloromethylphenyl)ethylmethyldimethoxysilane, (chloromethylphenyl)ethylmethyldiethoxysilane, chloromethylphenyltrimethoxysilane, chloromethylphenyltriethoxysilane, chloromethylphenylmethyldimethoxysilane, chloromethylphenylmethyldiethoxysilane, chlorophenyltriethoxysilane, chlorophenyltrimethoxysilane, 2-(4-chlorosulfonylphenyl)ethyltrimethoxysilane, 2-(4-chlorosulfonylphenyl)ethyltriethoxysilane, 3-cyanobutyltrimethoxysilane, 3-cyanobutyltriethoxysilane, (3-cyanobutyl)methyldimethoxysilane, (3-cyanobutyl)methyldiethoxysilane, 2-cyanoethylmethyldimethoxysilane, 2-cyanoethylmethyldiethoxysilane, 2-cyanoethyltrimethoxysilane, 2-cyanoethyltriethoxysilane, 3-cyanopropylmethyldimethoxysilane, 3-cyanopropylmethyldiethoxysilane, 3-cyanopropyltrimethoxysilane, 3-cyanopropyltriethoxysilane, 3-cyanopropylphenyldimethoxysilane, 3-cyanopropylphenyldiethoxysilane, 11-cyanoundecyltrimethoxysilane, [2-(3-cyclohexenyl)ethyl]dimethylmethoxysilane, [2-(3-cyclohexenyl)ethyl]dimethylethoxysilane, [2-(3-cyclohexenyl)ethyl]methyldimethoxysilane, [2-(3-cyclohexenyl)ethyl]methyldiethoxysilane, [2-(3-cyclohexenyl)ethyl]trimethoxysilane, [2-(3-cyclohexenyl)ethyl]triethoxysilane, cyclohexenyltrimethoxysilane, cyclohexenyltriethoxysilane, cyclooctenyltrimethoxysilane, cyclooctenyltriethoxysilane, (3-cyclopentadienylpropyl)triethoxysilane, diallyldimethoxysilane, diallyldiethoxysilane, dibenzyloxydimethoxysilane, dibenzyloxydiethoxysilane, dichlorophenyltrimethoxysilane, dichlorophenyltriethoxysilane, dimethoxydivinylsilane, diethoxydimethylsilane, 1,1-diethoxy-1-silacyclopent-3-ene, diethylphosphateethyltriethoxysilane, dimesityldimethoxysilane, dimesityldiethoxysilane, dimethoxyphenylphenyl-2-piperidinoethoxysilane, dimethylethoxyethynylsilane, 3-(2,4-dinitrophenylamino)propyltriethoxysilane, diphenyldimethoxysilane, diphenyldiethoxysilane, diphenylmethylethoxysilane, diphenylphosphinoethyldimethylethoxysilane, diphenylphosphinoethyltriethoxysilane, di(p-tolyl)diethoxysilane, 1,3-divinyltetraethoxydisiloxane, (furfuryloxymethyl)triethoxysilane, 5-hexenyltrimethoxysilane, 5-hexenyltriethoxysilane, 2-hydroxy-4-(3-triethoxysilylpropoxy)diphenyl ketone, 3-isocyanatepropyldimethylmethoxysilane, 3-isocyanatepropyldimethylethoxysilane, 3-isocyanatepropyltrimethoxysilane, 3-isocyanatepropyltriethoxysilane, O-(methacryloxyethyl)-N-(triethoxysilylpropyl)urethane, N-(3-methacryloxy-2-hydroxypropyl)-3-aminopropyltriethoxysilane, (methacryloxymethyl)dimethylmethoxysilane, (methacryloxymethyl)dimethylethoxysilane, methacryloxymethyltrimethoxysilane, methacryloxymethyltriethoxysilane, methacryloxymethyldimethoxysilane, methacryloxymethyldiethoxysilane, (methacryloxypropyl)dimethylmethoxysilane, (methacryloxypropyl)dimethylethoxysilane, methacryloxypropyltrimethoxysilane, methacryloxypropyltriethoxysilane, methacryloxypropylmethyldimethoxysilane, methacryloxypropylmethyldiethoxysilane, methoxyphenyltrimethoxysilane, methoxyphenyltriethoxysilane, methoxyphenylmethyldimethoxysilane, methoxyphenylmethyldiethoxysilane, methylphenethylmethyldimethoxysilane, methylphenethylmethyldiethoxysilane, 1,7-octadienyltriethoxysilane, octenyltrimethoxysilane, octenyltriethoxysilane, 7-octenyldimethylmethoxysilane, 7-octenyldimethylethoxysilane, phenethyltrimethoxysilane, phenethyltriethoxysilane, phenethyldimethylmethoxysilane, phenethylmethylethoxysilane, 3-phenoxypropyltrimethoxysilane, 3-phenoxypropyltriethoxysilane, m-phenoxyphenyldimethylmethoxysilane, m-phenoxyphenyldimethylethoxysilane, N-phenylaminopropyltrimethoxysilane, N-phenylaminopropyltriethoxysilane, phenyldimethoxysilane, phenyldiethoxysilane, phenyltrimethoxysilane, phenyltriethoxysilane, phenylmethyldimethoxysilane, phenylmethyldiethoxysilane, phenyldimethylmethoxysilane, phenyldimethylethoxysilane, N-1-phenylethyl-N'-triethoxysilylpropylurea, (3-phenylpropyl)dimethylmethoxysilane, (3-phenylpropyl)dimethylethoxysilane, (3-phenylpropyl)methyldimethoxysilane, (3-phenylpropyl)methyldiethoxysilane, O-(propalgyloxy)-N-(triethoxysilylpropyl)urethane, styrylethyltrimethoxysilane, styrylethyltriethoxysilane, 3-thiocyanatepropyltrimethoxysilane, 3-thiocyanatepropyltriethoxysilane, p-tolyltrimethoxysilane, p-tolyltriethoxysilane, tribenzylmethoxysilane, tribenzylethoxysilane, 2-(trimethoxysilyl)ethylpyridine, 2-(triethoxysilyl)ethylpyridine, 3-(triethoxysilylpropyl)-t-butylcarbamate, 3-(triethoxysilylpropyl)-ethylcarbamate, 3-(triethoxysilylpropyl)-methylcarbamate, N-[3-(triethoxysilyl)propyl]-2-carbomethoxyaziridine, N-(triethoxysilylpropyl)dansilamide, N-(3-triethoxysilylpropyl)-4,5-dihydroimidazole, 2-(triethoxysilylethyl)-5-(chloroacetoxy)bicycloheptane, N-(3-triethoxysilylpropyl)gluconamide, N-(3-triethoxysilylpropyl)-4-hydroxybutylamide, N-triethoxysilylpropyl-O-menthocarbamate, 3-(triethoxysilylpropyl)-p-nitrobenzamide, N-(triethoxysilylpropyl)-O-polyethyleneoxide urethane, N-triethoxysilylpropyl quineurethane, 3-(triethoxysilyl)propylsuccinic anhydride, N-[5-(trimethoxysilyl)-2-aza-1-oxopentyl]caprolactam, 2-(trimethoxysilylethyl)pyridine, 2-(triethoxysilylethyl)pyridine, N-(3-trimethoxysilylpropyl)pyrrole, N-(3-triethoxysilylpropyl)pyrrole, tris(3-trimethoxysilylpropyl)isocyanurate, tris(3-triethoxysilylpropyl)isocyanurate, urea propyltriethoxysilane, urea propyltriethoxysilane, O-(vinyloxyethyl)-N-(triethoxysilylpropyl)urethane, vinyldiphenylethoxysilane, vinyltrimethoxysilane, and vinyltriethoxysilane.

Among these compounds, in order to increase adhesion to a resist film and to ensure storage stability, trialkoxysilanes having a cyano group such as cyanoethyltriethoxysilane, trialkoxysilanes having a vinyl group such as vinyltriethoxysilane, trialkoxysilanes having a phenyl group such as phenyltriethoxysilane, trialkoxysilane having an isocyanate group such as 3-isocyanatepropyltriethoxysilane, trialkoxysilanes having a thioisocyanate group such as 3-thioisocyanatepropyltriethoxysilane, trialkoxysilanes having a carbamate group such as triethoxysilylpropylmethylcarbamate, triethoxysilylpropylethylcarbamate and triethoxysilylpropyl-t-butylcarbamate, and alkoxysilanes having an amide group such as N-(3-triethoxysilylpropyl)-4-hydroxycarbamate are preferable.

From the viewpoint of increasing the reflection preventing function to absorb catoptric light from the ground, trialkoxysilanes having a phenyl group such as phenyltriethoxysilane, 3-phenoxypropyltrimethoxysilane, phenethyltriethoxysilane, benzoylpropyltriethoxysilane, benzyltriethoxysilane, bis(triethoxysilylethyl)benzene, and methoxyphenyltriethoxysilane, and trialkoxysilanes having a pyridine ring such as 2-(triethoxysilylethyl)pyridine are preferable.

<Silane Compound (B)>

The silane compound (B) is represented by the formula (B), $Si(OR^3)_4$, wherein $R^3$ represents a monovalent organic group. As examples of the silane compound (B), tetramethoxysilane, tetraethoxysilane, tetra-n-propoxysilane, tetra-iso-propoxysilane, tetra-n-butoxysilane, tetra-sec-butoxysilane, tetra-tert-butoxysilane, and tetraphenoxysilane can be given.

The silicone content in the composition for a resist underlayer film of the present invention can be increased and the mask resistance during the etching process can be improved by using silane compound (B).

<Silane Compound (C)>

The silane compound (C) is represented by the formula (C),

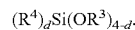

$(R^4)_d Si(OR^3)_{4-d}$.

In the formula (C), $R^3$ represents a monovalent organic group, $R^4$ individually represents a hydrogen atom, a halogen atom or a monovalent organic group (excluding $R^1$ and $OR^3$), and d is an integer of 1 to 3.

As examples of the monovalent organic group represented by $R^4$, alkyl groups and the like which may have a substituent, such as a methyl group, an ethyl group, a n-propyl group, an iso-propyl group, an n-butyl group, a sec-butyl group, a tert-butyl group, a γ-aminopropyl group, a γ-glycidoxypropyl group and a γ-trifluoropropyl group can be given.

The following compounds can be given as examples of the silane compound (C): trimethoxysilane, triethoxysilane, tri-n-propoxysilane, tri-iso-propoxysilane, tri-n-butoxysilane, tri-sec-butoxysilane, tri-tert-butoxysilane, triphenoxysilane, fluorotrimethoxysilane, fluorotriethoxysilane, fluorotri-n-propoxysilane, fluorotri-iso-propoxysilane, fluorotri-n-butoxysilane, fluorotri-sec-butoxysilane, fluorotri-tert-butoxysilane, fluorotriphenoxysilane, methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-tert-butoxysilane, n-propyltriphenoxysilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-sec-butoxysilane, iso-propyltri-tert-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-tert-butoxysilane, n-butyltriphenoxysilane, sec-butyltrimethoxysilane, sec-butyl-iso-triethoxysilane, sec-butyl-tri-n-propoxysilane, sec-butyl-tri-iso-propoxysilane, sec-butyl-tri-n-butoxysilane, sec-butyl-tri-sec-butoxysilane, sec-butyl-tri-tert-butoxysilane, sec-butyl-triphenoxysilane, tert-butyltrimethoxysilane, tert-butyltriethoxysilane, tert-butyltri-n-propoxysilane, tert-butyltri-iso-propoxysilane, tert-butyltri-n-butoxysilane, tert-butyltri-sec-butoxysilane, tert-butyltri-tert-butoxysilane, tert-butyltriphenoxysilane, γ-aminopropyltrimethoxysilane, γ-aminopropyltriethoxysilane, γ-glycidoxypropyltrimethoxysilane, γ-glycidoxypropyltriethoxysilane, γ-trifluoropropyltrimethoxysilane, γ-trifluoropropyltriethoxysilane, dimethyldimethoxysilane, dimethyldiethoxysilane, dimethyl-di-n-propoxysilane, dimethyl-di-iso-propoxysilane, dimethyl-di-n-butoxysilane, dimethyl-di-sec-butoxysilane, dimethyl-di-tert-butoxysilane, dimethyldiphenoxysilane, diethyldimethoxysilane, diethyldiethoxysilane, diethyl-di-n-propoxysilane, diethyl-di-iso-propoxysilane, diethyl-di-n-butoxysilane, diethyl-di-sec-butoxysilane, diethyl-di-tert-butoxysilane, diethyldiphenoxysilane, di-n-propyldimethoxysilane, di-n-propyldiethoxysilane, di-n-propyl-di-n-propoxysilane, di-n-propyl-di-iso-propoxysilane, di-n-propyl-di-n-butoxysilane, di-n-propyl-di-sec-butoxysilane, di-n-propyl-di-tert-butoxysilane, di-n-propyl-diphenoxysilane, di-iso-propyldimethoxysilane, di-iso-propyldiethoxysilane, di-iso-propyl-di-n-propoxysilane, di-iso-propyl-di-iso-propoxysilane, di-iso-propyl-di-n-butoxysilane, di-iso-propyl-di-sec-butoxysilane, di-iso-propyl-di-tert-butoxysilane, di-iso-propyl-diphenoxysilane, di-n-butyldimethoxysilane, di-n-butyldiethoxysilane, di-n-butyl-di-n-propoxysilane, di-n-butyl-di-iso-propoxysilane, di-n-butyl-di-n-butoxysilane, di-n-butyl-di-sec-butoxysilane, di-n-butyl-di-tert-butoxysilane, di-n-butyl-diphenoxysilane, di-sec-butyldimethoxysilane, di-sec-butyldiethoxysilane, di-sec-butyl-di-n-propoxysilane, di-sec-butyl-di-iso-propoxysilane, di-sec-butyl-di-n-butoxysilane, di-sec-butyl-di-sec-butoxysilane, di-sec-butyl-di-tert-butoxysilane, di-sec-butyl-diphenoxysilane, di-tert-butyldimethoxysilane, di-tert-butyldiethoxysilane, di-tert-butyl-di-n-propoxysilane, di-tert-butyl-di-iso-propoxysilane, di-tert-butyl-di-n-butoxysilane, di-tert-butyl-di-sec-butoxysilane, di-tert-butyl-di-tert-butoxysilane, di-tert-butyl-diphenoxysilane, di-γ-aminopropyldimethoxysilane, di-γ-aminopropyldiethoxysilane, di-γ-glycidoxypropyldimethoxysilane, di-γ-glycidoxypropyldiethoxysilane, di-γ-trifluoropropyldimethoxysilane, di-γ-trifluoropropyldiethoxysilane, trimethylmonomethoxysilane, trimethylmonoethoxysilane, trimethylmono-n-propoxysilane, trimethylmono-iso-propoxysilane, trimethylmono-n-butoxysilane, trimethylmono-sec-butoxysilane, trimethylmono-tert-butoxysilane, trimethylmonophenoxysilane, triethylmonomethoxysilane, triethylmonoethoxysilane, triethylmono-n-propoxysilane, triethylmono-iso-propoxysilane, triethylmono-n-butoxysilane, triethylmono-sec-butoxysilane, triethylmono-tert-butoxysilane, triethylmonophenoxysilane, tri-n-propylmono-n-propylmethoxysilane, tri-n-propyl-mono-n-ethoxysilane, tri-n-propylmono-n-propoxysilane, tri-n-propylmono-iso-propoxysilane, tri-n-propylmono-n-butoxysilane, tri-n-propylmono-tert-butoxysilane, tri-n-propylmono-sec-butoxysilane, tri-n-propylmonophenoxysilane, tri-iso-propylmonomethoxysilane, tri-iso-propylmono-n-propoxysilane, tri-iso-propylmono-iso-propoxysilane, tri-iso-propylmono-n-butoxysilane, tri-iso-propylmono-sec-butoxysilane, tri-iso-propylmono-tert-butoxysilane, tri-iso-propylmonophenoxysilane, N-(2-aminoethyl)-3-aminopropylmethyldimethoxysilane, N-(2-aminoethyl)-3-aminopropylmethyldiethoxysilane, and bis(2-hydroxyethyl)-3-aminopropyltriethoxysilane.

Among these compounds, in order to improve storage stability of the composition, methyltriethoxysilane, methyltrimethoxysilane, ethyltriethoxysilane, ethyltrimethoxysilane, propyltriethoxysilane, propyltrimethoxysilane, iso-propyltriethoxysilane, iso-propyltrimethoxysilane, butyltriethoxysilane, butyltrimethoxysilane, sec-butyltriethoxysilane, sec-butyltrimethoxysilane, and bis(2-hydroxyethyl)-3-aminopropyltriethoxysilane are preferable.

[Process for Producing Composition for Resist Underlayer Film]

The above silane compounds (A) to (C) can be used either individually or in combination of two or more. When a monoalkoxysilane in which the value of a in the above-mentioned silane compound (A) is 3 or a dialkoxysilane in which the value of a is 2 is used, it is preferable to use a trialkoxysilane in which the value a is 1 in combination in order to obtain a composition having required curability. The same applies to the silane compound (C).

When the composition for a resist underlayer film of the present invention contains a hydrolyzate and/or a condensate of a mixture of the silane compound (A) and the silane compound (B), the proportion of the silane compound (A) in the mixture is 1 to 99 mol %, and preferably 5 to 95 mol %, and the proportion of the silane compound (B) is 1 to 99 mol %, and preferably 5 to 95 mol %, provided that the total amount of the silane compound (A) and the silane compound (B) is 100 mol %. The proportion of the silane compounds (A) and (B) in the above-mentioned ranges can ensure production of a resist underlayer film excelling in adhesion with a resist film, reflection preventing function and storage stability. The same proportion desirably applies to the case in which a hydrolyzate and/or a condensate of the silane compound (A) is blended with a hydrolyzate and/or a condensate of the silane compound (B).

When the composition for a resist underlayer film of the present invention contains a hydrolyzate and/or a condensate of a mixture of the silane compound (A) and the silane compound (C), the proportion of the silane compound (A) in the mixture is 1 to 99 mol %, and preferably 5 to 95 mol %, and the proportion of the silane compound (C) is 1 to 99 mol %, and preferably 5 to 95 mol %, provided that the total amount of the compound (A) and the compound (C) is 100 mol %. The proportion of the silane compounds (A) and (C) in the above-mentioned ranges can ensure excellent storage stability of the composition and production of a resist underlayer film excelling in adhesion with a resist film, reflection preventing function and storage stability. The same proportion desirably applies to the case in which a hydrolyzate and/or a condensate of the silane compound (A) is blended with a hydrolyzate and/or a condensate of the silane compound (C).

When the composition for a resist underlayer film of the present invention contains a hydrolyzate and/or a condensate of a mixture of the silane compound (A), the silane compound (B) and the silane compound (C), the proportion of the silane compound (A) in the mixture is 1 to 98 mol %, and preferably 5 to 90 mol %, the proportion of the silane compound (B) is 1 to 98 mol %, and preferably 5 to 90 mol %, and the proportion of the silane compound (C) is 1 to 98 mol %, and preferably 5 to 90 mol %, provided that the total amount of the silane compounds (A), (B) and (C) is 100 mol %. The proportion of the silane compounds (A), (B) and (C) in the above-mentioned ranges can ensure excellent storage stability of the composition and production of resist underlayer film excelling in adhesion with a resist film, reflection preventing function and storage stability. The same proportion desirably applies to the case in which the hydrolyzate and/or condensate of the silane compound (B) and the hydrolyzate and/or condensate of the silane compound (C) are blended with the hydrolyzate and/or condensate of the silane compound (A).

The process for producing the composition for a resist underlayer film of the present invention comprises a step of hydrolyzing and/or condensing the above-mentioned silane compound or a mixture of the silane compounds in an organic acid in the presence of water and a catalyst. More specifically, the above-mentioned silane compound is dissolved in an organic solvent, and water is added intermittently or continuously to the resulting solution. In this instance, the catalyst may be previously dispersed in the organic solvent or may be dissolved or dispersed in water which is added later. The temperature of the hydrolysis reaction and/or condensation reaction is usually 0 to 100° C.

Although there are no particular limitations to the water used for the hydrolysis reaction and/or condensation reaction, ion-exchanged water is preferably used. The water is used in an amount of 0.25 to 3 mols, and preferably 0.3 to 2.5 mols, per one mol of the alkoxyl groups in all silane compounds used in the reactions. If the amount of water in this range is used, there will be no possibility of a decrease in uniformity of the formed coating and almost no possibility of a decrease in storage stability of the resulting composition.

There are no particular limitations to the organic solvent insofar as the organic solvent used in this type of reaction is selected. As examples of preferable organic solvents, propylene glycol monoethyl ether, propylene glycol monomethyl ether and propylene glycol monopropyl ether can be given.

As examples of the catalyst, a metal chelate compound, an organic acid, an inorganic acid, an organic base and an inorganic base can be given.

As examples of the metal chelate compound, a titanium chelate compound, a zirconium chelate compound, and an aluminum chelate compound can be given. Specifically, compounds described in the patent document 1 (Japanese Patent Application Laid-open No. 2000-356854) and the like can be used.

As examples of the organic acid, acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, shikimic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid can be given. As examples of the inorganic acid, hydrochloric acid, nitric acid, sulfuric acid, hydrofluoric acid, and phosphoric acid can be given.

As examples of the organic base, pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene, and tetramethylammonium hydroxide can be given. As examples of the inorganic base, ammonia, sodium hydroxide, potassium hydroxide, barium hydroxide, and calcium hydroxide can be given.

Of these compounds, the metal chelate compound, organic acid, and inorganic acid are preferable. These catalysts can be used either individually or in combination of two or more. The catalyst is usually used in the amount of 0.001 to 10 parts by weight, preferably 0.01 to 10 parts by weight, for 100 parts by weight of the silane compounds (as $SiO_2$).

After the hydrolysis and/or condensation of the silane compounds, it is preferable to remove reaction by-products such as a lower alcohol (e.g. methanol and ethanol). Since such a treatment increases the purity of the organic solvent, a composition for a resist underlayer film having an outstanding application property and good storage stability can be obtained.

Any method which does not cause the reaction of the hydrolyzate and/or condensate of the silane compound to proceed can be used for removing the reaction by-products without a particular limitation. For example, the reaction by-products can be removed by evaporation under reduced pressure when the boiling point of the reaction by-products is lower than the boiling point of the organic solvent.

The composition for a resist underlayer film of the present invention obtained in this manner preferably has a solid component concentration of 1 to 20% by weight, and particularly 1 to 15% by weight. After removing the reaction by-product, the above-mentioned organic solvent may be further added in order to adjust the solid component concentration.

[Other Components]

The composition for a resist underlayer film of the present invention preferably comprises a compound which generates an acid (hereinafter referred to from time to time as "acid generator") by ultraviolet radiation and/or heat treatment. If the composition contains such an acid generator, an acid is generated in the resist underlayer film by exposing the resist to light or by heating after exposure, and supplied to the interface of the resist underlayer film and the resist film. As a result, a resist pattern having excellent resolution and reproducibility can be formed in an alkali development treatment of the resist film.

As the acid generator, a compound which generates an acid by ultraviolet radiation (hereinafter referred to from time to time as "latent photo acid generator") and a compound which generates an acid by heat treatment (hereinafter referred to from time to time as "latent heat acid generator") can be given.

As examples of the latent photo acid generator, onium salt photo acid generators, halogen-containing compound photo acid generators, diazoketone compound photo acid generators, sulfonic acid compound photo acid generators, and sulfonate compound photo acid generators can be given. As examples of the latent heat acid generator, onium salts such as sulfonium salts, benzothiazolium salts, ammonium salts, and phosphonium salts can be given. Of these, sulfonium salts and benzothiazolium salts are particularly preferable. As more specific compounds, the compounds described in the patent document 1 and the like can be given.

The composition for a resist underlayer film of the present invention may further contain β-diketone which increases uniformity of a coating film formed therefrom and the storage stability. As examples of the β-diketone, acetylacetone, 2,4-hexanedione, 2,4-heptanedione, 3,5-heptanedione, 2,4-octanedione, 3,5-octanedione, 2,4-nonanedione, 3,5-nonanedione, 5-methyl-2,4-hexanedione, 2,2,6,6-tetramethyl-3,5-heptanedione, and 1,1,1,5,5,5-hexafluoro-2,4-heptanedione can be given. These β-diketones can be used either individually or in combination of two or more. The β-diketones can be used in a range of 1 to 50 parts by weight, and preferably 3 to 30 parts by weight, for 100 parts by weight of the total amount of the β-diketones and the organic solvents.

The composition for a resist underlayer film of the present invention may further comprise components such as colloidal silica, colloidal alumina, an organic polymer, and a surfactant. As examples of the organic polymer, a compound having a polyalkylene oxide structure, a compound having a sugar chain structure, a vinylamide polymer, a (meth)acrylate compound, an aromatic vinyl compound, a dendrimer, a polyimide, a polyamic acid, a polyarylene, a polyamide, a polyquinoxaline, a polyoxadiazole, and a fluorine-containing polymer can be given. As examples of the surfactant, nonionic surfactants, anionic surfactants, cationic surfactants, amphoteric surfactants, silicon-containing surfactants, polyalkylene oxide surfactants, and fluorine-containing surfactants can be given.

[Method for Forming Resist Underlayer Film]

A resist underlayer film can be prepared, for example, by applying the composition for a resist underlayer film of the present invention to the surface of an antireflection film to form a coating and heating the coating, or when the composition contains a latency photo acid generator, by ultraviolet radiation and heat treatment.

As the method for applying the composition for a resist underlayer film of the present invention, a spin coating method, a roll coating method, a dip coating method, and the like may be used. The temperature for heating the coating formed is usually 50 to 450° C., and the thickness of the resulting film is usually from 10 to 200 nm.

The resist underlayer film formed in the manner as mentioned above has high adhesion with a resist film, has high resistance to a resist developer and oxygen ashing for removing a resist, and can produce a resist pattern with high reproducibility.

EXAMPLES

The present invention is described below in more detail by way of examples. Note that the present invention is not limited to the following examples.

Example 1

0.54 g of maleic anhydride was dissolved in 10.8 g of water while heating to prepare an aqueous solution of maleic acid. Next, a flask was charged with 4.35 g of cyanoethyltriethoxysilane, 2.40 g of phenyltriethoxysilane, 12.5 g of methyltriethoxysilane, and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 16.1%. The molecular weight (Mw) of the resulting product (the solid component) was 1,000.

11.88 g of the reaction product obtained as mentioned above was dissolved in 17.39 g of propylene glycol monoethyl ether. The solution was filtered through a filter with a pore size of 0.2 μm to obtain a composition for a resist underlayer film.

Example 2

0.54 g of maleic anhydride was dissolved in 10.8 g of water while heating to prepare an aqueous solution of maleic acid. Next, a flask was charged with 9.51 g of vinyltriethoxysilane, 8.92 g of methyltriethoxysilane, and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 12.1%. The Mw of the resulting product (the solid component) was 1,200.

11.88 g of the reaction product obtained as mentioned above was dissolved in 17.39 g of propylene glycol monoethyl ether. The solution was filtered through a filter with a pore size of 0.2 μm to obtain a composition for a resist underlayer film.

Example 3

0.54 g of maleic anhydride was dissolved in 10.8 g of water while heating to prepare an aqueous solution of maleic acid. Next, a flask was charged with 10.67 g of 3-isocyanatepropyltriethoxysilane, 8.92 g of methyltriethoxysilane, and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 15.7%. The Mw of the resulting product (the solid component) was 1,100.

14.89 g of the reaction product obtained as mentioned above was dissolved in 30.79 g of propylene glycol monoethyl ether. The solution was filtered through a filter with a pore size of 0.2 μm to obtain a composition for a resist underlayer film.

Example 4

0.54 g of maleic anhydride was dissolved in 10.8 g of water while heating to prepare an aqueous solution of maleic acid. Next, a flask was charged with 3.23 g of tetraethoxysilane, 19.56 g of vinyltriethoxysilane, and 58.7 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 17.8%. The Mw of the resulting product (the solid component) was 1,700.

12.89 g of the reaction product obtained as mentioned above was dissolved in 32.54 g of propylene glycol monoethyl ether. The solution was filtered through a filter with a pore size of 0.2 μm to obtain a composition for a resist underlayer film.

Example 5

0.54 g of maleic anhydride was dissolved in 10.8 g of water with heat to prepare an aqueous solution of maleic acid. Next, a flask was charged with 10.54 g of tetraethoxysilane, 9.69 g of methyltriethoxysilane, 1.92 g of phenyltriethoxysilane, and 51.2 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 15.4%. The Mw of the resulting product (the solid component) was 1,800.

15.90 g of the reaction product obtained as mentioned above was dissolved in 30.09 g of propylene glycol monoethyl ether. The solution was filtered through a filter with a pore size of 0.2 μm to obtain a composition for a resist underlayer film.

Example 6

11.88 g of the reaction product (solid component concentration: 16.1%) obtained in Example 1 and 0.02 g of triphenylsulfonium trifluoromethanesulfonate were dissolved in 17.39 g of propylene glycol monoethyl ether. The solution was filtered through a filter with a pore size of 0.2 μm to obtain a composition for a resist underlayer film.

Example 7

0.54 g of maleic anhydride was dissolved in 10.8 g of water while heating to prepare an aqueous solution of maleic acid. Next, a flask was charged with 10.54 g of tetraethoxysilane, 9.69 g of methyltriethoxysilane, 1.83 g of methacryloxypropyltriethoxysilane, and 51.2 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 16.4%. The Mw of the resulting product (the solid component) was 1,800.

15.90 g of the reaction product obtained as mentioned above was dissolved in 30.09 g of propylene glycol monoethyl ether. The solution was filtered through a filter with a pore size of 0.2 μm to obtain a composition for a resist underlayer film.

Example 8

0.54 g of maleic anhydride was dissolved in 10.8 g of water while heating to prepare an aqueous solution of maleic acid. Next, a flask was charged with 10.54 g of tetraethoxysilane, 9.69 g of methyltriethoxysilane, 1.13 g of N-(triethoxysilylpropyl)dansilamide, and 51.2 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 18.4%. The Mw of the resulting product (the solid component) was 1,800.

15.90 g of the reaction product obtained as mentioned above was dissolved in 30.09 g of propylene glycol monoethyl ether. The solution was filtered through a filter with a pore size of 0.2 μm to obtain a composition for a resist underlayer film.

Example 9

0.54 g of maleic anhydride was dissolved in 10.8 g of water while heating to prepare an aqueous solution of maleic acid. Next, a flask was charged with 10.54 g of tetraethoxysilane, 9.69 g of methyltriethoxysilane, 1.43 g of styrylethyltriethoxysilane, and 51.2 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 18.4%. The Mw of the resulting product (the solid component) was 1,800.

15.90 g of the reaction product obtained as mentioned above was dissolved in 30.09 g of propylene glycol monoethyl ether. The solution was filtered through a filter with a pore size of 0.2 μm to obtain a composition for a resist underlayer film.

Example 10

0.54 g of maleic anhydride was dissolved in 10.8 g of water while heating to prepare an aqueous solution of maleic acid. Next, a flask was charged with 10.54 g of tetraethoxysilane, 9.69 g of methyltriethoxysilane, 1.33 g of 2-(triethoxysilylethyl)pyridine, and 51.2 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 18.4%. The Mw of the resulting product (the solid component) was 1,800.

15.90 g of the reaction product obtained as mentioned above was dissolved in 30.09 g of propylene glycol monoethyl ether. The solution was filtered through a filter with a pore size of 0.2 μm to obtain a composition for a resist underlayer film.

Example 11

16.7 g of tetraethoxysilane and 1.2 g of phenyltriethoxysilane were dissolved in 53.5 g of propylene glycol monopropyl ether, and the solution was heated at 60° C. 11.3 g of a previously-prepared maleic acid aqueous solution (5% aqueous solution) was added to the solution and reacted. After four hours, the reaction solution was cooled and condensed under reduced pressure to remove ethanol produced in the reaction and adjust the concentration of the reaction solution. The amount of the reaction solution was 47.8 g. The Mw of the resulting product (the solid component) was 1,600.

Example 12

16.7 g of methyltriethoxysilane and 1.2 g of phenyltriethoxysilane were dissolved in 53.5 g of propylene glycol mono-propyl ether, and the solution was heated at 60° C. 11.3 g of a previously-prepared maleic acid aqueous solution (5% aqueous solution) was added to the solution and reacted. After four hours, the reaction solution was cooled and condensed under reduced pressure to remove ethanol produced in the reaction and adjust the concentration of the reaction solution. The a mount of the reaction solution was 49.5 g. The Mw of the resulting product (the solid component) was 1,350.

Example 13

16.7 g of tetraethoxysilane and 2.7 g of methyltriethoxysilane were dissolved in 53.5 g of propylene glycol mono-propyl ether, and the solution was heated at 60° C. 11.3 g of a previously-prepared maleic acid aqueous solution (5% aqueous solution) was added to the solution and reacted. After four hours, the reaction solution was cooled and condensed under reduced pressure to remove ethanol produced in the reaction and adjust the concentration of the reaction solution. The amount of the reaction solution was 49.9 g. The Mw of the resulting product (the solid component) was 2,100.

Example 14

16.7 g of phenyltriethoxysilane was dissolved in 53.5 g of propylene glycol mono-propyl ether, and the solution was heated at 60° C. 11.3 g of a previously-prepared maleic acid aqueous solution (5% aqueous solution) was added to the solution and reacted. After four hours, the reaction solution was cooled and condensed under reduced pressure to remove ethanol produced in the reaction and adjust the concentration of the reaction solution. The amount of the reaction solution was 54.1 g. The Mw of the resulting product (the solid component) was 800.

Example 15

16.7 g of methyltriethoxysilane was dissolved in 53.5 g of propylene glycol mono-propyl ether, and the solution was heated at 60° C. 11.3 g of a previously-prepared maleic acid aqueous solution (5% aqueous solution) was added to the solution and reacted. After four hours, the reaction solution was cooled and condensed under reduced pressure to remove ethanol produced in the reaction and adjust the concentration of the reaction solution. The amount of the reaction solution was 50.9 g. The Mw of the resulting product (the solid component) was 1,900.

Example 16

11.88 g of the reaction product obtained in Example 11 and 1.2 g of the reaction product obtained in Example 15 were dissolved in 17.39 g of propylene glycol monoethyl ether. The solution was filtered through a filter with a pore size of 0.2 μm to obtain a composition for a resist underlayer film.

Example 17

11.88 g of the reaction product obtained in Example 13 and 1.2 g of the reaction product obtained in Example 14 were dissolved in 17.39 g of propylene glycol monoethyl ether. The solution was filtered through a filter with a pore size of 0.2 μm to obtain a composition for a resist underlayer film.

Example 18

11.88 g of the reaction product obtained in Example 13 and 3.0 g of the reaction product obtained in Example 12 were dissolved in 17.39 g of propylene glycol monoethyl ether. The solution was filtered through a filter with a pore size of 0.2 μm to obtain a composition for a resist underlayer film.

Example 19

11.88 g of the reaction product obtained in Example 5 and 1.2 g of the reaction product obtained in Example 15 were dissolved in 17.39 g of propylene glycol monoethyl ether. The solution was filtered through a filter with a pore size of 0.2 μm to obtain a composition for a resist underlayer film.

Example 20

11.88 g of the reaction product obtained in Example 12 was dissolved in 17.39 g of propylene glycol monoethyl ether. The solution was filtered through a filter with a pore size of 0.2 μm to obtain a composition for a resist underlayer film.

Example 21

11.88 g of the reaction product obtained in Example 5 and 0.02 g of triphenylsulfonium trifluoromethanesulfonate were dissolved in 17.39 g of propylene glycol monoethyl ether. The solution was filtered through a filter with a pore size of 0.2 μm to obtain a composition for a resist underlayer film.

Example 22

0.54 g of maleic anhydride was dissolved in 10.8 g of water while heating to prepare an aqueous solution of maleic acid. Next, a flask was charged with 14.1 g of phenyltriethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product. The solid component in the resulting reaction product was measured by the calcinating method. As a result, the concentration was found to be 15.4% (resin solution (i)). The Mw of the resulting product (the solid component) was 950.

Next, 0.54 g of maleic anhydride was dissolved in 10.8 g of water in while heating to prepare an aqueous solution of maleic acid. Next, a flask was charged with 21.5 g of methyltriethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product. The solid component in the resulting reaction product was measured by the calcinating method. As a result, the concentration was found to be 19.4% (resin solution (ii)). The Mw of the resulting product (the solid component) was 1,850.

4.77 g of resin solution (i) and 7.23 g of resin solution (ii) obtained as mentioned above were dissolved in 17.39 g of propylene glycol monoethyl ether. The solution was filtered through a filter with a pore size of 0.2 μm to obtain a composition for a resist underlayer film.

Example 23

0.54 g of maleic anhydride was dissolved in 10.8 g of water while heating to prepare an aqueous solution of maleic acid. Next, a flask was charged with 18.1 g of vinyltriethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product. The solid component in the resulting reaction product was measured by the calcinating method. As a result, the concentration was found to be 18.4% (resin solution (iii)). The Mw of the resulting product (the solid component) was 1,260.

Next, 0.54 g of maleic anhydride was dissolved in 10.8 g of water in while heating to prepare an aqueous solution of maleic acid. Next, a flask was charged with 26.5 g of tetraethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product. The solid component in the resulting reaction product was measured by the calcinating method. As a result, the concentration was found to be 18.9% (resin solution (iv)). The Mw of the resulting product (the solid component) was 2,100.

5.99 g of resin solution (iii) and 6.21 g of resin solution (iv) obtained as mentioned above were dissolved in 17.39 g of propylene glycol monoethyl ether. The solution was filtered through a filter with a pore size of 0.2 μm to obtain a composition for a resist underlayer film.

Example 24

0.54 g of maleic anhydride was dissolved in 10.8 g of water while heating to obtain an aqueous solution of maleic acid. Next, a flask was charged with 6.0 g of phenyltriethoxysilane, 12.1 g of methyltriethoxysilane, and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product. The solid component in the resulting reaction product was measured by the calcinating method. As a result, the concentration was found to be 16.9% (resin solution (v)). The Mw of the resulting product (the solid component) was 1,350.

Next, 0.54 g of maleic anhydride was dissolved in 10.8 g of water in while heating to prepare an aqueous solution of maleic acid. Next, a flask was charged with 26.5 g of tetraethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product. The solid component in the resulting reaction product was measured by the calcinating method. As a result, the concentration was found to be 18.9% (resin solution (vi)). The Mw of the resulting product (the solid component) was 2,100.

3.21 g of resin solution (v) and 8.67 g of resin solution (vi) obtained as mentioned above were dissolved in 17.39 g of propylene glycol monoethyl ether. The solution was filtered through a filter with a pore size of 0.2 μm to obtain a composition for a resist underlayer film.

Example 25

0.54 g of maleic anhydride was dissolved in 10.8 g of water while heating to prepare an aqueous solution of maleic acid. Next, a flask was charged with 15.94 g of tetraethoxysilane, 5.53 g of vinyltriethoxysilane, 0.67 g of phenyltriethoxysilane, and 51.2 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 14.4%. The Mw of the resulting product (the solid component) was 1,500.

15.90 g of the reaction product obtained as mentioned above was dissolved in 30.09 g of propylene glycol monoethyl ether. The solution was filtered through a filter with a pore size of 0.2 μm to obtain a composition for a resist underlayer film.

Comparative Example 1

0.54 g of maleic anhydride was dissolved in 10.8 g of water while heating to prepare an aqueous solution of maleic acid. Next, a flask was charged with 18.71 g of tetraethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 15.7%. The Mw of the resulting product (the solid component) was 2,100.

14.89 g of the reaction product obtained as mentioned above was dissolved in 30.79 g of propylene glycol monoethyl ether. The solution was filtered through a filter with a pore size of 0.2 μm to obtain a composition for a resist underlayer film.

Comparative Example 2

0.54 g of maleic anhydride was dissolved in 10.8 g of water while heating to prepare an aqueous solution of maleic acid. Next, a flask was charged with 16.18 g of butyltriethoxysilane and 53.5 g of propylene glycol monopropyl ether. The flask was installed with a cooling tube and a dripping funnel containing the previously-prepared maleic acid aqueous solution. After heating to 100° C. in an oil bath, the maleic acid aqueous solution was slowly added dropwise, followed by stirring at 100° C. for four hours. After the reaction, the flask containing the reaction solution was allowed to cool and then installed on an evaporator to remove ethanol produced during the reaction, thereby obtaining a reaction product.

The solid component in the resulting reaction product was measured by the calcinating method. As a result, the concentration was found to be 14.9%. The Mw of the resulting product (the solid component) was 1,800.

12.1 g of the reaction product obtained as mentioned above was dissolved in 31.90 g of propylene glycol monoethyl ether. The solution was filtered through a filter with a pore size of 0.2 μm to obtain a composition for a resist underlayer film.

Comparative Example 3

11.88 g of the reaction product obtained in Example 13 was dissolved in 17.39 g of propylene glycol monoethyl ether. The solution was filtered through a filter with a pore size of 0.2 μm to obtain a composition for a resist underlayer film.

[Evaluation of Composition for Resist Underlayer Film]

The following evaluations were carried out using the compositions for a resist underlayer film prepared in Examples 1 to 10 and 16 to 25, and Comparative Examples 1 to 3. The results obtained in Examples 1 to 10 and Comparative Examples 1 to 3 are shown in Table 1, and the results obtained in Examples 16 to 25 are shown in Table 2.

(1) Adhesion of Resist

Adhesion of the resist underlayer film made from the composition for a resist underlayer film with the resist film formed on the underlayer film was evaluated as follows.

An antireflection film material (NFC B007™ manufactured by JSR Corp.) was applied onto the surface of a silicon wafer using a spin coater and dried on a hot plate at 190° C. for one minute to form an antireflection film with a thickness of 300 nm. The substrate with the antireflection film formed thereon in this manner was used as a substrate for the adhesion test. The composition for a resist underlayer film was applied onto the antireflection film surface of this substrate using a spin coater and dried on a hot plate at 200° C. for one minute, followed by baking on a hot plate at 300° C., to form a resist underlayer film with a thickness of 110 nm.

Next, a resist material (ARF001S™ manufactured by JSR Corp.) was applied to the resist underlayer film then dried at 130° C. for 90 seconds. In this instance, the resist film thickness was controlled to 340 nm. The substrate was irradiated with an ArF excimer laser (wavelength: 193 nm) at a dose of 32 mJ using an ArF excimer laser irradiation equipment (manufactured by NIKON Corp.) through a mask made from quartz with a 0.2 μm line-and-space pattern. The substrate was then heated at 130° C. for 90 seconds and developed in a 2.38% aqueous solution of tetramethylammonium hydroxide for 30 seconds to form a resist pattern.

The resist pattern formed on the substrate in this manner was inspected by a scanning electron microscope (SEM). The sample was evaluated as "O" when there was no development delamination in the resist pattern, and as "X" when there was development delamination.

(2) Reproducibility of Resist Pattern

The resist pattern formed on the substrate in the manner mentioned above was inspected by SEM. The sample was evaluated as "O" when the 0.2 μm line-and-space pattern of the optical mask was correctly reproduced without any residual membrane of resist in the area irradiated with laser beam, and otherwise as "X".

(3) Alkali Resistance Evaluation

The film thickness of the resist underlayer film before the substrate was immersed in a developer was compared with the film thickness of the resist underlayer film after having been immersed in the developer in above development step. The sample was evaluated as "O" when the thickness difference was 2 nm or less, and as "X" when the thickness difference was more than 2 nm.

(4) Anti-Oxygen Ashing

The resist underlayer film formed in the manner mentioned above was subjected to an oxygen ashing treatment using a barrel-type oxygen plasma asher (PR-501™ manufactured by Yamato Scientific Co., Ltd.) at 300 W for 15 seconds. When the difference of the resist underlayer film thickness before and after the treatment was 5 nm or less, the sample was evaluated as "O", and as "X" when the thickness difference was more than 5 nm.

(5) Storage Stability of Solution

The composition for a resist underlayer film was applied to the surface of a silicon wafer while running a spin coater at 2,000 rpm for 20 seconds, and dried on a hot plate at 190° C. for two minutes to form a resist underlayer film. The thickness of the resist underlayer film obtained was measured at 50 points using an optical film-thickness meter (UV-1280SE™ manufactured by KLA-Tencor), and the average was determined.

A resist underlayer film was prepared in the same manner as above using the composition for a resist underlayer film after storing for one month at 40° C., and the average thickness was determined in the same manner as above.

The difference $(T-T_0)$ of the average film thickness of the underlayer film made from the composition for a resist underlayer film before storing $(T_0)$ and the average thickness of the underlayer film made from the composition for a resist underlayer film after storing (T) was determined, and the ratio of the difference to the average film thickness, $(T-T_0)/T_0$, was calculated as the rate of film thickness change. The sample was evaluated as "O" when the rate of film thickness change was 10% or less, and as "X" when the rate of film thickness change was more than 10%.

TABLE 1

| | Example | | | | | | | | | | Comparative Example | | |
|---|---|---|---|---|---|---|---|---|---|---|---|---|---|
| | 1 | 2 | 3 | 4 | 5 | 6 | 7 | 8 | 9 | 10 | 1 | 2 | 3 |
| (1) Adhesion of resist | ○ | ○ | ○ | ○ | ○ | ○ | ○ | ○ | ○ | ○ | X | ○ | ○ |
| (2) Reproducibility of resist pattern | ○ | ○ | ○ | ○ | ○ | ○ | ○ | ○ | ○ | ○ | X | X | X |
| (3) Alkali resistance (change in thickness/nm) | ○ (0.4) | ○ (0.3) | ○ (0.5) | ○ (0.2) | ○ (0.3) | ○ (0.4) | ○ (0.7) | ○ (0.6) | ○ (0.4) | ○ (0.7) | ○ (0.2) | X (2.4) | ○ (0.4) |
| (4) Anti-oxygen ashing (change in thickness/nm) | ○ (3.5) | ○ (3.8) | ○ (3.4) | ○ (4.3) | ○ (2.1) | ○ (3.6) | ○ (4.2) | ○ (4.6) | ○ (4.8) | ○ (4.4) | ○ (2.8) | ○ (3.4) | ○ (2.4) |
| (5) Storage stability (increase in thickness/%) | ○ (0.5) | ○ (0.8) | ○ (2.1) | ○ (1.5) | ○ (7.8) | ○ (0.5) | ○ (0.5) | ○ (0.8) | ○ (2.1) | ○ (1.5) | X (10.1) | ○ (1.1) | ○ (1.1) |

TABLE 2

| | Example | | | | | | | | | |
|---|---|---|---|---|---|---|---|---|---|---|
| | 16 | 17 | 18 | 19 | 20 | 21 | 22 | 23 | 24 | 25 |
| (1) Adhesion of resist | ○ | ○ | ○ | ○ | ○ | ○ | ○ | ○ | ○ | ○ |
| (2) Reproducibility of resist pattern | ○ | ○ | ○ | ○ | ○ | ○ | ○ | ○ | ○ | ○ |
| (3) Alkali resistance (change in thickness/nm) | ○ (0.4) | ○ (0.4) | ○ (0.3) | ○ (0.5) | ○ (0.2) | ○ (0.4) | ○ (0.5) | ○ (0.6) | ○ (0.7) | ○ (0.3) |
| (4) Anti-oxygen ashing (change in thickness/nm) | ○ (3.5) | ○ (3.5) | ○ (3.8) | ○ (3.4) | ○ (4.3) | ○ (3.6) | ○ (4.5) | ○ (2.8) | ○ (0.9) | ○ (2.6) |
| (5) Storage stability (increase in thickness/%) | ○ (1.5) | ○ (1.2) | ○ (0.8) | ○ (1.6) | ○ (1.5) | ○ (1.5) | ○ (0.5) | ○ (4.5) | ○ (4.9) | ○ (6.8) |

As clear from Table 1 and Table 2, the compositions for a resist underlayer film of Examples 1 to 10 and 16 to 25 have excellent storage stability and can form a resist underlayer film exhibiting high adhesion with a resist, having excellent alkali resistance and oxygen ashing resistance, and being capable of producing a resist pattern with high reproducibility.

The invention claimed is:

1. A composition for a resist underlayer film comprising a condensate of a mixture consisting of 5 to 90 mol % of at least one silane compound represented by the following formula (A), 5 to 90 mol % of at least one silane compound represented by the following formula (B) and 5 to 90 mol % of at least one silane compound represented by the following formula (C), or a condensate of a mixture consisting of 5 to 95 mol % of at least two silane compounds represented by the following formula (A) and 5 to 95 mol % of at least one silane compound represented by the following formula (C), $$R^1Si(OR^3)_3 \quad (A)$$

wherein $R^1$ is a cyanoethyl group, 3-isocyanatepropyl group, or methacryloxypropyl group, and $R^3$ individually represents a monovalent organic group, $$Si(OR^3)_4 \quad (B)$$

wherein $R^3$ individually represents a monovalent organic group, $$(R^4)_dSi(OR^3)_{4-d} \quad (C)$$

wherein $R^3$ individually represents a monovalent organic group, and $R^4$ individually represents a methyl group, an ethyl group, an n-propyl group, an iso-propyl group, an n-butyl group, a sec-butyl group or a tert-butyl group, and d is an integer of 1 to 3.

2. The composition for a resist underlayer film according to claim 1, wherein the condensate is a condensate of a mixture consisting of at least one silane compound represented by the above formula (A), at least one silane compound represented by the above formula (B), and at least one silane compound represented by the above formula (C).

3. The composition for a resist underlayer film according to claim 1, wherein the condensate is a condensate of a mixture consisting of at least two silane compounds represented by the above formula (A) and at least one silane compound represented by the above formula (C).

4. A composition for a resist underlayer film comprising
(I) a condensate of a mixture consisting of at least two compounds selected from the group consisting a silane compound represented by the following formula (A), a silane compound represented by the following formula (B), and a silane compound represented by the following formula (C), and
(II) a condensate of a mixture consisting of at least one compound selected from the group consisting of the silane compound (A), the silane compound (B), and the silane compound (C), wherein the silane compound (A) is included in at least one of the mixtures for preparing the component (I) and the component (II), the silane compound (B) is included in at least one of the mixtures for preparing the component (I) and the component (II), and the silane compound (C) is included in at least one of the mixtures for preparing the component (I) and the component (II), provided that the component (I) and the component (II) are different, and when the mixture for preparing the component (I) or the component (II) is a mixture containing the silane compound (A) and the silane compound (B), the proportion of the silane compound (A) is 5 to 95 mol % and the proportion of the silane compound (B) is 5 to 95 mol %, provided that the total amount of the silane compounds (A) and (B) is 100 mol %, when the mixture for preparing the component (I) or the component (II) is a mixture containing the silane compound (A) and the silane compound (C), the proportion of the silane compound (A) is 5 to 95 mol % and the proportion of the silane compound (C) is 5 to 95 mol %, provided that the total amount of the silane compounds (A) and (C) is 100 mol %, and when the mixture for preparing the component (I) or the component (II) is a mixture containing the silane compound (A), the silane compound (B) and the silane compound (C), the proportion of the silane compound (A) is 5 to 90 mol %, the proportion of the silane compound (B) is 5 to 90 mol % and the proportion of the silane compound (C) is 5 to 90 mol %, provided that the total amount of the silane compounds (A), (B) and (C) is 100 mol %, $$R^1Si(OR^3)_3 \quad (A)$$

wherein $R^1$ is a cyanoethyl group, 3-isocyanatepropyl group, or methacryloxypropyl group, and $R^3$ individually represents a monovalent organic group, $$Si(OR^3)_4 \quad (B)$$

wherein $R^3$ individually represents a monovalent organic group, and $$(R^4)_dSi(OR^3)_{4-d} \quad (C)$$

wherein $R^3$ individually represents a monovalent organic group, and $R^4$ individually represents a methyl group, an ethyl group, an n-propyl group, an iso-propyl group, an n-butyl group, a sec-butyl group or a tert-butyl group, and d is an integer of 1 to 3.

5. The composition for a resist underlayer film according to claim 1, further comprising an acid-producing compound which generates an acid by irradiation of ultraviolet radiation and/or by heating.

6. A process for producing the composition for a resist underlayer film according to claim 1, comprising a step of hydrolyzing and/or condensing the silane compound used in the composition in an organic acid in the presence of water and a catalyst.

7. The composition for a resist underlayer film according to claim 2, further comprising an acid-producing compound which generates an acid by irradiation of ultraviolet radiation and/or by heating.

8. The composition for a resist underlayer film according to claim 3, further comprising an acid-producing compound which generates an acid by irradiation of ultraviolet radiation and/or by heating.

9. The composition for a resist underlayer film according to claim 4, further comprising an acid-producing compound which generates an acid by irradiation of ultraviolet radiation and/or by heating.

10. A process for producing the composition for a resist underlayer film according to claim 2, comprising a step of hydrolyzing and/or condensing the silane compound used in the composition in an organic acid in the presence of water and a catalyst.

11. A process for producing the composition for a resist underlayer film according to claim 3, comprising a step of hydrolyzing and/or condensing the silane compound used in the composition in an organic acid in the presence of water and a catalyst.

12. A process for producing the composition for a resist underlayer film according to claim 4, comprising a step of hydrolyzing and/or condensing the silane compound used in the composition in an organic acid in the presence of water and a catalyst.

* * * * *